(12) United States Patent
Eisenbeiser et al.

(10) Patent No.: US 7,005,717 B2
(45) Date of Patent: Feb. 28, 2006

(54) SEMICONDUCTOR DEVICE AND METHOD

(75) Inventors: Kurt Eisenbeiser, Tempe, AZ (US);
Jun Wang, Gilbert, AZ (US);
Ravindranath Droopad, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/845,523

(22) Filed: May 14, 2004

(65) Prior Publication Data

US 2005/0023622 A1   Feb. 3, 2005

Related U.S. Application Data

(63) Continuation of application No. 09/584,601, filed on May 31, 2000, now abandoned.

(51) Int. Cl.
*H01L 29/76*   (2006.01)

(52) U.S. Cl. .................. 257/410; 257/52; 257/411; 438/216; 438/261; 438/421

(58) Field of Classification Search ............. 257/52, 257/410, 411; 438/482, 216, 261, 421, 591, 438/595, 287, 954, 981
See application file for complete search history.

(56) References Cited

U.S. PATENT DOCUMENTS

| | | | |
|---|---|---|---|
| 3,617,951 A | 11/1971 | Anderson | |
| 3,670,213 A | 6/1972 | Nakawaga et al. | |
| 3,758,199 A | 9/1973 | Thaxter | |
| 3,766,370 A | 10/1973 | Walther | |
| 3,802,967 A | 4/1974 | Ladany et al. | |
| 3,818,451 A | 6/1974 | Coleman | |
| 3,914,137 A | 10/1975 | Huffman et al. | |
| 3,935,031 A | 1/1976 | Adler | |
| 4,006,989 A | 2/1977 | Andringa | |
| 4,084,130 A | 4/1978 | Holton | |
| 4,120,588 A | 10/1978 | Chaum | |
| 4,146,297 A | 3/1979 | Alferness et al. | |
| 4,174,422 A | 11/1979 | Matthews et al. | |
| 4,174,504 A | 11/1979 | Chenausky et al. | |
| 4,177,094 A | 12/1979 | Kroon | |
| 4,242,595 A | 12/1980 | Lehovec | |
| 4,284,329 A | 8/1981 | Smith et al. | |
| 4,289,920 A | 9/1981 | Hovel | |
| 4,297,656 A | 10/1981 | Pan | |
| 4,298,247 A | 11/1981 | Michelet et al. | |
| 4,378,259 A | 3/1983 | Hasegawa et al. | |
| 4,392,297 A | 7/1983 | Little | |
| 4,398,342 A | 8/1983 | Pitt et al. | |
| 4,404,265 A | 9/1983 | Manasevit | |

(Continued)

FOREIGN PATENT DOCUMENTS

DE   196 07 107   8/1997

(Continued)

OTHER PUBLICATIONS

Halliday and Resnick, Fundamentals of Physics, 1986, John Wiley & Sons, pp. 509, 510, 532, 533.*

(Continued)

*Primary Examiner*—Nathan J. Flynn
*Assistant Examiner*—Scott R. Wilson
(74) *Attorney, Agent, or Firm*—Oblon, Spivak, McClelland, Maier & Neustadt, P.C.

(57) ABSTRACT

Circuit (10) has a dual layer gate dielectric (29) formed over a semiconductor substrate (14). The gate dielectric includes an amorphous layer (40) and a monocrystalline layer (42). The monocrystalline layer typically has a higher dielectric constant than the amorphous layer.

20 Claims, 2 Drawing Sheets

U.S. PATENT DOCUMENTS

| | | |
|---|---|---|
| 4,424,589 A | 1/1984 | Thomas et al. |
| 4,439,014 A | 3/1984 | Stacy et al. |
| 4,442,590 A | 4/1984 | Stockton et al. |
| 4,447,116 A | 5/1984 | King et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,525,871 A | 6/1985 | Foyt et al. |
| 4,594,000 A | 6/1986 | Falk et al. |
| 4,626,878 A | 12/1986 | Kuwano et al. |
| 4,629,821 A | 12/1986 | Bronstein-Bonte et al. |
| 4,661,176 A | 4/1987 | Manasevit |
| 4,667,088 A | 5/1987 | Kramer et al. |
| 4,667,212 A | 5/1987 | Nakamura |
| 4,681,982 A | 7/1987 | Yoshida |
| 4,695,120 A | 9/1987 | Holder |
| 4,723,321 A | 2/1988 | Saleh |
| 4,748,485 A | 5/1988 | Vasudev |
| 4,756,007 A | 7/1988 | Qureshi et al. |
| 4,772,929 A | 9/1988 | Manchester |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,843,609 A | 6/1989 | Ohya et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,218 A | 10/1989 | Pessa et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,563 A | 7/1991 | Feit et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,064,781 A | 11/1991 | Cambou et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura et al. |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,679 A | 6/1992 | Ishii et al. |
| 5,122,852 A | 6/1992 | Chang et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,166,761 A | 11/1992 | Olson et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,188,976 A | 2/1993 | Kume et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,238,877 A | 8/1993 | Russell |
| 5,244,818 A | 9/1993 | Jokers et al. |
| 5,248,564 A | 9/1993 | Ramesh |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |
| 5,281,834 A | 1/1994 | Cambou et al. |
| 5,283,462 A | 2/1994 | Stengel |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |
| 5,312,765 A | 5/1994 | Kanber |
| 5,313,058 A | 5/1994 | Friederich et al. |
| 5,314,547 A | 5/1994 | Heremans et al. |
| 5,315,128 A | 5/1994 | Hunt et al. |
| 5,323,023 A | 6/1994 | Fork |
| 5,326,721 A | 7/1994 | Summerfelt |
| 5,334,556 A | 8/1994 | Guldi |
| 5,352,926 A | 10/1994 | Andrews |
| 5,356,509 A | 10/1994 | Terranova et al. |
| 5,356,831 A | 10/1994 | Calviello et al. |
| 5,357,122 A | 10/1994 | Okubora et al. |
| 5,358,925 A | 10/1994 | Neville Connell et al. |
| 5,362,972 A | 11/1994 | Yazawa et al. |
| 5,362,998 A | 11/1994 | Iwamura et al. |
| 5,365,477 A | 11/1994 | Cooper, Jr. et al. |

| | | | | | |
|---|---|---|---|---|---|
| 5,371,621 A | 12/1994 | Stevens | 5,561,305 A | 10/1996 | Smith |
| 5,371,734 A | 12/1994 | Fischer | 5,569,953 A | 10/1996 | Kikkawa et al. |
| 5,372,992 A | 12/1994 | Itozaki et al. | 5,570,226 A | 10/1996 | Ota |
| 5,373,166 A | 12/1994 | Buchan et al. | 5,572,052 A | 11/1996 | Kashihara et al. |
| 5,387,811 A | 2/1995 | Saigoh | 5,574,296 A | 11/1996 | Park et al. |
| 5,391,515 A | 2/1995 | Kao et al. | 5,574,589 A | 11/1996 | Feuer et al. |
| 5,393,352 A | 2/1995 | Summerfelt | 5,574,744 A | 11/1996 | Gaw et al. |
| 5,394,489 A | 2/1995 | Koch | 5,576,879 A | 11/1996 | Nashimoto |
| 5,395,663 A | 3/1995 | Tabata et al. | 5,578,162 A | 11/1996 | D'Asaro et al. |
| 5,397,428 A | 3/1995 | Stoner et al. | 5,585,167 A | 12/1996 | Satoh et al. |
| 5,399,898 A | 3/1995 | Rostoker | 5,585,288 A | 12/1996 | Davis et al. |
| 5,404,581 A | 4/1995 | Honjo | 5,588,995 A | 12/1996 | Sheldon |
| 5,405,802 A | 4/1995 | Yamagata et al. | 5,589,284 A | 12/1996 | Summerfelt et al. |
| 5,406,202 A | 4/1995 | Mehrgardt et al. | 5,596,205 A | 1/1997 | Reedy et al. |
| 5,410,622 A | 4/1995 | Okada et al. | 5,596,214 A | 1/1997 | Endo |
| 5,418,216 A | 5/1995 | Fork | 5,602,418 A | 2/1997 | Imai et al. |
| 5,418,389 A | 5/1995 | Watanabe | 5,603,764 A | 2/1997 | Matsuda et al. |
| 5,420,102 A | 5/1995 | Harshavardhan et al. | 5,606,184 A | 2/1997 | Abrokwah et al. |
| 5,427,988 A | 6/1995 | Sengupta et al. | 5,608,046 A | 3/1997 | Cook et al. |
| 5,430,397 A | 7/1995 | Itoh et al. | 5,610,744 A | 3/1997 | Ho et al. |
| 5,436,759 A | 7/1995 | Dijaili et al. | 5,614,739 A | 3/1997 | Abrokwah et al. |
| 5,438,584 A | 8/1995 | Paoli et al. | 5,619,051 A | 4/1997 | Endo |
| 5,441,577 A | 8/1995 | Sasaki et al. | 5,621,227 A | 4/1997 | Joshi |
| 5,442,191 A | 8/1995 | Ma | 5,623,439 A | 4/1997 | Gotoh et al. |
| 5,442,561 A | 8/1995 | Yoshizawa et al. | 5,623,552 A | 4/1997 | Lane |
| 5,444,016 A | 8/1995 | Abrokwah et al. | 5,629,534 A | 5/1997 | Inuzuka et al. |
| 5,446,719 A | 8/1995 | Yoshida et al. | 5,633,724 A | 5/1997 | King et al. |
| 5,450,812 A | 9/1995 | McKee et al. | 5,635,433 A | 6/1997 | Sengupta |
| 5,452,118 A | 9/1995 | Maruska | 5,635,453 A | 6/1997 | Pique et al. |
| 5,453,727 A | 9/1995 | Shibasaki et al. | 5,640,267 A | 6/1997 | May et al. |
| 5,466,631 A | 11/1995 | Ichikawa et al. | 5,642,371 A | 6/1997 | Tohyama et al. |
| 5,473,047 A | 12/1995 | Shi | 5,650,646 A | 7/1997 | Summerfelt |
| 5,473,171 A | 12/1995 | Summerfelt | 5,656,382 A | 8/1997 | Nashimoto |
| 5,477,363 A | 12/1995 | Matsuda | 5,659,180 A | 8/1997 | Shen et al. |
| 5,478,653 A | 12/1995 | Guenzer | 5,661,112 A | 8/1997 | Hatta et al. |
| 5,479,033 A | 12/1995 | Baca et al. | 5,666,376 A | 9/1997 | Cheng |
| 5,479,317 A | 12/1995 | Ramesh | 5,667,586 A | 9/1997 | Ek et al. |
| 5,480,829 A | 1/1996 | Abrokwah et al. | 5,668,048 A | 9/1997 | Kondo et al. |
| 5,481,102 A | 1/1996 | Hazelrigg, Jr. | 5,670,798 A | 9/1997 | Schetzina |
| 5,482,003 A | 1/1996 | McKee et al. | 5,670,800 A | 9/1997 | Nakao et al. |
| 5,484,664 A | 1/1996 | Kitahara et al. | 5,674,366 A | 10/1997 | Hayashi et al. |
| 5,486,406 A | 1/1996 | Shi | 5,674,813 A | 10/1997 | Nakamura et al. |
| 5,491,461 A | 2/1996 | Partin et al. | 5,679,947 A | 10/1997 | Doi et al. |
| 5,492,859 A | 2/1996 | Sakaguchi et al. | 5,679,965 A | 10/1997 | Schetzina |
| 5,494,711 A | 2/1996 | Takeda et al. | 5,682,046 A | 10/1997 | Takahashi et al. |
| 5,504,035 A | 4/1996 | Rostoker et al. | 5,684,302 A | 11/1997 | Wersing et al. |
| 5,504,183 A | 4/1996 | Shi | 5,686,741 A | 11/1997 | Ohori et al. |
| 5,508,554 A | 4/1996 | Takatani et al. | 5,689,123 A | 11/1997 | Major et al. |
| 5,510,665 A | 4/1996 | Conley | 5,693,140 A | 12/1997 | McKee et al. |
| 5,511,238 A | 4/1996 | Bayraktaroglu | 5,696,392 A | 12/1997 | Char et al. |
| 5,512,773 A | 4/1996 | Wolf et al. | 5,719,417 A | 2/1998 | Roeder et al. |
| 5,514,484 A | 5/1996 | Nashimoto | 5,725,641 A | 3/1998 | MacLeod |
| 5,514,904 A | 5/1996 | Onga et al. | 5,729,394 A | 3/1998 | Sevier et al. |
| 5,515,047 A | 5/1996 | Yamakido et al. | 5,729,641 A | 3/1998 | Chandonnet et al. |
| 5,515,810 A | 5/1996 | Yamashita et al. | 5,731,220 A | 3/1998 | Tsu et al. |
| 5,516,725 A | 5/1996 | Chang et al. | 5,733,641 A | 3/1998 | Fork et al. |
| 5,519,235 A | 5/1996 | Ramesh | 5,734,672 A | 3/1998 | McMinn et al. |
| 5,523,602 A | 6/1996 | Horiuchi et al. | 5,735,949 A | 4/1998 | Mantl et al. |
| 5,528,057 A | 6/1996 | Yanagase et al. | 5,741,724 A | 4/1998 | Ramdani et al. |
| 5,528,067 A | 6/1996 | Farb et al. | 5,745,631 A | 4/1998 | Reinker |
| 5,528,209 A | 6/1996 | Macdonald et al. | 5,753,300 A | 5/1998 | Wessels et al. |
| 5,528,414 A | 6/1996 | Oakley | 5,753,928 A | 5/1998 | Krause |
| 5,530,235 A | 6/1996 | Stefik et al. | 5,753,934 A | 5/1998 | Yano et al. |
| 5,538,941 A | 7/1996 | Findikoglu et al. | 5,754,319 A | 5/1998 | Van De Voorde et al. |
| 5,540,785 A | 7/1996 | Dennard et al. | 5,754,714 A | 5/1998 | Suzuki et al. |
| 5,541,422 A | 7/1996 | Wolf et al. | 5,760,426 A | 6/1998 | Marx et al. |
| 5,548,141 A | 8/1996 | Morris et al. | 5,760,427 A | 6/1998 | Onda |
| 5,549,977 A | 8/1996 | Jin et al. | 5,760,740 A | 6/1998 | Blodgett |
| 5,551,238 A | 9/1996 | Prueitt | 5,764,676 A | 6/1998 | Paoli et al. |
| 5,552,547 A | 9/1996 | Shi | 5,767,543 A | 6/1998 | Ooms et al. |
| 5,553,089 A | 9/1996 | Seki et al. | 5,770,887 A | 6/1998 | Tadatomo et al. |
| 5,556,463 A | 9/1996 | Guenzer | 5,772,758 A | 6/1998 | Collins et al. |
| 5,559,368 A | 9/1996 | Hu et al. | 5,776,359 A | 7/1998 | Schultz et al. |

| Patent No. | Date | Inventor |
|---|---|---|
| 5,776,621 A | 7/1998 | Nashimoto |
| 5,777,350 A | 7/1998 | Nakamura et al. |
| 5,777,762 A | 7/1998 | Yamamoto |
| 5,778,018 A | 7/1998 | Yoshikawa et al. |
| 5,778,116 A | 7/1998 | Tomich |
| 5,780,311 A | 7/1998 | Beasom et al. |
| 5,789,733 A | 8/1998 | Jachimowicz et al. |
| 5,789,845 A | 8/1998 | Wadaka et al. |
| 5,790,583 A | 8/1998 | Ho |
| 5,792,569 A | 8/1998 | Sun et al. |
| 5,792,679 A | 8/1998 | Nakato |
| 5,796,648 A | 8/1998 | Kawakubo et al. |
| 5,801,072 A | 9/1998 | Barber |
| 5,801,105 A | 9/1998 | Yano et al. |
| 5,807,440 A | 9/1998 | Kubota et al. |
| 5,810,923 A | 9/1998 | Yano et al. |
| 5,812,272 A | 9/1998 | King et al. |
| 5,814,583 A | 9/1998 | Itozaki et al. |
| 5,825,055 A | 10/1998 | Summerfelt |
| 5,825,799 A | 10/1998 | Ho et al. |
| 5,827,755 A | 10/1998 | Yonehara et al. |
| 5,828,080 A | 10/1998 | Yano et al. |
| 5,830,270 A | 11/1998 | McKee et al. |
| 5,831,960 A | 11/1998 | Jiang et al. |
| 5,833,603 A | 11/1998 | Kovacs et al. |
| 5,834,362 A | 11/1998 | Miyagaki et al. |
| 5,838,035 A | 11/1998 | Ramesh |
| 5,838,053 A | 11/1998 | Bevan et al. |
| 5,844,260 A | 12/1998 | Ohori |
| 5,846,846 A | 12/1998 | Suh et al. |
| 5,852,687 A | 12/1998 | Wickham |
| 5,857,049 A | 1/1999 | Beranek et al. |
| 5,858,814 A | 1/1999 | Goossen et al. |
| 5,861,966 A | 1/1999 | Ortel |
| 5,863,326 A | 1/1999 | Nause et al. |
| 5,864,171 A | 1/1999 | Yamamoto et al. |
| 5,869,845 A | 2/1999 | Vander Wagt et al. |
| 5,872,493 A | 2/1999 | Ella |
| 5,873,977 A | 2/1999 | Desu et al. |
| 5,874,860 A | 2/1999 | Brunel et al. |
| 5,878,175 A | 3/1999 | Sonoda et al. |
| 5,879,956 A | 3/1999 | Seon et al. |
| 5,880,452 A | 3/1999 | Plesko |
| 5,882,948 A | 3/1999 | Jewell |
| 5,883,564 A | 3/1999 | Partin |
| 5,883,996 A | 3/1999 | Knapp et al. |
| 5,886,867 A | 3/1999 | Chivukula et al. |
| 5,888,296 A | 3/1999 | Ooms et al. |
| 5,889,296 A | 3/1999 | Imamura et al. |
| 5,896,476 A | 4/1999 | Wisseman et al. |
| 5,905,571 A | 5/1999 | Butler et al. |
| 5,907,792 A | 5/1999 | Droopad et al. |
| 5,912,068 A | 6/1999 | Jia |
| 5,919,515 A | 7/1999 | Yano et al. |
| 5,919,522 A | 7/1999 | Baum et al. |
| 5,926,493 A | 7/1999 | O'Brien et al. |
| 5,926,496 A | 7/1999 | Ho et al. |
| 5,937,115 A | 8/1999 | Domash |
| 5,937,274 A | 8/1999 | Kondow et al. |
| 5,937,285 A | 8/1999 | Abrokwah et al. |
| 5,948,161 A | 9/1999 | Kizuki |
| 5,953,468 A | 9/1999 | Finnila et al. |
| 5,955,591 A | 9/1999 | Imbach et al. |
| 5,959,308 A | 9/1999 | Shichijo et al. |
| 5,959,879 A | 9/1999 | Koo |
| 5,962,069 A | 10/1999 | Schindler et al. |
| 5,963,291 A | 10/1999 | Wu et al. |
| 5,966,323 A | 10/1999 | Chen et al. |
| 5,976,953 A | 11/1999 | Zavracky et al. |
| 5,977,567 A | 11/1999 | Verdiell |
| 5,981,400 A | 11/1999 | Lo |
| 5,981,976 A | 11/1999 | Murasato |
| 5,981,980 A | 11/1999 | Miyajima et al. |
| 5,984,190 A | 11/1999 | Nevill |
| 5,985,404 A | 11/1999 | Yano et al. |
| 5,986,301 A | 11/1999 | Fukushima et al. |
| 5,987,011 A | 11/1999 | Toh |
| 5,987,196 A | 11/1999 | Noble |
| 5,990,495 A | 11/1999 | Ohba |
| 5,995,359 A | 11/1999 | Klee et al. |
| 5,995,528 A | 11/1999 | Fukunaga et al. |
| 5,997,638 A | 12/1999 | Copel et al. |
| 5,998,781 A | 12/1999 | Vawter et al. |
| 5,998,819 A | 12/1999 | Yokoyama et al. |
| 6,002,375 A | 12/1999 | Corman et al. |
| 6,008,762 A | 12/1999 | Nghiem |
| 6,011,641 A | 1/2000 | Shin et al. |
| 6,011,646 A | 1/2000 | Mirkarimi et al. |
| 6,013,553 A | 1/2000 | Wallace et al. |
| 6,020,222 A | 2/2000 | Wollesen |
| 6,022,140 A | 2/2000 | Fraden et al. |
| 6,022,410 A | 2/2000 | Yu et al. |
| 6,022,671 A | 2/2000 | Binkley et al. |
| 6,022,963 A | 2/2000 | McGall et al. |
| 6,023,082 A | 2/2000 | McKee et al. |
| 6,028,853 A | 2/2000 | Haartsen |
| 6,039,803 A | 3/2000 | Fitzgerald et al. |
| 6,045,626 A | 4/2000 | Yano et al. |
| 6,046,464 A | 4/2000 | Schetzina |
| 6,048,751 A | 4/2000 | D'Asaro et al. |
| 6,049,110 A | 4/2000 | Koh |
| 6,049,702 A | 4/2000 | Tham et al. |
| 6,051,858 A | 4/2000 | Uchida et al. |
| 6,051,874 A | 4/2000 | Masuda |
| 6,055,179 A | 4/2000 | Koganei et al. |
| 6,058,131 A | 5/2000 | Pan |
| 6,059,895 A | 5/2000 | Chu et al. |
| 6,064,078 A | 5/2000 | Northrup et al. |
| 6,064,092 A | 5/2000 | Park |
| 6,064,783 A | 5/2000 | Congdon et al. |
| 6,078,717 A | 6/2000 | Nashimoto et al. |
| 6,080,378 A | 6/2000 | Yokota et al. |
| 6,083,697 A | 7/2000 | Beecher et al. |
| 6,087,681 A | 7/2000 | Shakuda |
| 6,088,216 A | 7/2000 | Laibowitz et al. |
| 6,090,659 A | 7/2000 | Laibowitz et al. |
| 6,093,302 A | 7/2000 | Montgomery |
| 6,096,584 A | 8/2000 | Ellis-Monaghan et al. |
| 6,100,578 A | 8/2000 | Suzuki |
| 6,103,008 A | 8/2000 | McKee et al. |
| 6,103,403 A | 8/2000 | Grigorian et al. |
| 6,107,653 A | 8/2000 | Fitzgerald |
| 6,107,721 A | 8/2000 | Lakin |
| 6,108,125 A | 8/2000 | Yano |
| 6,110,813 A | 8/2000 | Ota et al. |
| 6,110,840 A | 8/2000 | Yu |
| 6,113,225 A | 9/2000 | Miyata et al. |
| 6,113,690 A | 9/2000 | Yu et al. |
| 6,114,996 A | 9/2000 | Nghiem |
| 6,121,642 A | 9/2000 | Newns |
| 6,121,647 A | 9/2000 | Yano et al. |
| 6,128,178 A | 10/2000 | Newns |
| 6,134,114 A | 10/2000 | Ungermann et al. |
| 6,136,666 A | 10/2000 | So |
| 6,137,603 A | 10/2000 | Henmi |
| 6,139,483 A | 10/2000 | Seabaugh et al. |
| 6,140,746 A | 10/2000 | Miyashita et al. |
| 6,143,072 A | 11/2000 | McKee et al. |
| 6,143,366 A | 11/2000 | Lu |
| 6,146,906 A | 11/2000 | Inoue et al. |
| 6,150,239 A | 11/2000 | Goesele et al. |
| 6,151,240 A | 11/2000 | Suzuki |
| 6,153,010 A | 11/2000 | Kiyoku et al. |
| 6,153,454 A | 11/2000 | Krivokapic |
| 6,156,581 A | 12/2000 | Vaudo et al. |
| 6,173,474 B1 | 1/2001 | Conrad |

| | | |
|---|---|---|
| 6,174,755 B1 | 1/2001 | Manning |
| 6,175,497 B1 | 1/2001 | Tseng et al. |
| 6,175,555 B1 | 1/2001 | Hoole |
| 6,180,252 B1 | 1/2001 | Farrell et al. |
| 6,180,486 B1 | 1/2001 | Leobandung et al. |
| 6,181,920 B1 | 1/2001 | Dent et al. |
| 6,184,044 B1 | 2/2001 | Sone et al. |
| 6,184,144 B1 | 2/2001 | Lo |
| 6,191,011 B1 | 2/2001 | Gilboa et al. |
| 6,194,753 B1 | 2/2001 | Seon et al. |
| 6,197,503 B1 | 3/2001 | Vo-Dinh et al. |
| 6,198,119 B1 | 3/2001 | Nabatame et al. |
| 6,204,525 B1 | 3/2001 | Sakurai et al. |
| 6,204,737 B1 | 3/2001 | Ella |
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,232,242 B1 | 5/2001 | Hata et al. |
| 6,232,806 B1 | 5/2001 | Woeste et al. |
| 6,232,910 B1 | 5/2001 | Bell et al. |
| 6,233,435 B1 | 5/2001 | Wong |
| 6,235,145 B1 | 5/2001 | Li et al. |
| 6,238,946 B1 | 5/2001 | Ziegler |
| 6,239,012 B1 | 5/2001 | Kinsman |
| 6,239,449 B1 | 5/2001 | Fafard et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,253,649 B1 | 7/2001 | Shinjo |
| 6,255,198 B1 | 7/2001 | Linthicum et al. |
| 6,256,426 B1 | 7/2001 | Duchet |
| 6,265,749 B1 | 7/2001 | Gardner et al. |
| 6,268,269 B1 | 7/2001 | Lee et al. |
| 6,271,619 B1 | 8/2001 | Yamada et al. |
| 6,275,122 B1 | 8/2001 | Speidell et al. |
| 6,277,436 B1 | 8/2001 | Stauf et al. |
| 6,278,137 B1 | 8/2001 | Shimoyama et al. |
| 6,278,138 B1 | 8/2001 | Suzuki |
| 6,278,523 B1 | 8/2001 | Gorecki |
| 6,278,541 B1 | 8/2001 | Baker |
| 6,291,319 B1 | 9/2001 | Yu et al. |
| 6,291,866 B1 | 9/2001 | Wallace et al. |
| 6,297,598 B1 | 10/2001 | Wang et al. |
| 6,297,842 B1 | 10/2001 | Koizumi et al. |
| 6,300,615 B1 | 10/2001 | Shinohara et al. |
| 6,306,668 B1 | 10/2001 | McKee et al. |
| 6,307,996 B1 | 10/2001 | Nashimoto et al. |
| 6,312,819 B1 | 11/2001 | Jia et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,319,730 B1 | 11/2001 | Ramdani et al. |
| 6,320,238 B1 * | 11/2001 | Kizilyalli et al. ........... 257/410 |
| 6,326,637 B1 | 12/2001 | Parkin et al. |
| 6,326,645 B1 | 12/2001 | Kadota |
| 6,326,667 B1 | 12/2001 | Sugiyama et al. |
| 6,329,277 B1 | 12/2001 | Liu et al. |
| 6,338,756 B1 | 1/2002 | Dietze |
| 6,339,664 B1 | 1/2002 | Farjady et al. |
| 6,340,788 B1 | 1/2002 | King et al. |
| 6,341,851 B1 | 1/2002 | Takayama et al. |
| 6,343,171 B1 | 1/2002 | Yoshimura et al. |
| 6,345,424 B1 | 2/2002 | Hasegawa et al. |
| 6,348,373 B1 | 2/2002 | Ma et al. |
| 6,355,945 B1 | 3/2002 | Kadota et al. |
| 6,359,330 B1 | 3/2002 | Goudard |
| 6,362,017 B1 | 3/2002 | Manabe et al. |
| 6,362,558 B1 | 3/2002 | Fukui |
| 6,367,699 B1 | 4/2002 | Ackley |
| 6,372,356 B1 | 4/2002 | Thornton et al. |
| 6,372,813 B1 | 4/2002 | Johnson et al. |
| 6,376,337 B1 | 4/2002 | Wang et al. |
| 6,389,209 B1 | 5/2002 | Suhir |
| 6,391,674 B1 | 5/2002 | Ziegler |
| 6,392,253 B1 | 5/2002 | Saxena |
| 6,392,257 B1 | 5/2002 | Ramdani et al. |
| 6,393,167 B1 | 5/2002 | Davis et al. |
| 6,404,027 B1 | 6/2002 | Hong et al. |
| 6,410,941 B1 | 6/2002 | Taylor et al. |
| 6,410,947 B1 | 6/2002 | Wada |
| 6,411,756 B1 | 6/2002 | Sadot et al. |
| 6,415,140 B1 | 7/2002 | Benjamin et al. |
| 6,417,059 B1 | 7/2002 | Huang |
| 6,419,849 B1 | 7/2002 | Qiu et al. |
| 6,427,066 B1 | 7/2002 | Grube |
| 6,432,546 B1 | 8/2002 | Ramesh et al. |
| 6,438,281 B1 | 8/2002 | Tsukamoto et al. |
| 6,445,724 B1 | 9/2002 | Abeles |
| 6,452,232 B1 | 9/2002 | Adan |
| 6,461,927 B1 | 10/2002 | Mochizuki et al. |
| 6,462,360 B1 | 10/2002 | Higgins, Jr. et al. |
| 6,477,285 B1 | 11/2002 | Shanley |
| 6,496,469 B1 | 12/2002 | Uchizaki |
| 6,498,358 B1 | 12/2002 | Lach et al. |
| 6,501,121 B1 | 12/2002 | Yu et al. |
| 6,504,189 B1 | 1/2003 | Matsuda et al. |
| 6,524,651 B1 | 2/2003 | Gan et al. |
| 6,528,374 B1 | 3/2003 | Bojarczuk, Jr. et al. |
| 6,538,359 B1 | 3/2003 | Hiraku et al. |
| 6,589,887 B1 | 7/2003 | Dalton et al. |
| 2001/0013313 A1 | 8/2001 | Droopad et al. |
| 2001/0020278 A1 | 9/2001 | Saito |
| 2001/0036142 A1 | 11/2001 | Kadowaki et al. |
| 2001/0055820 A1 | 12/2001 | Sakurai et al. |
| 2002/0006245 A1 | 1/2002 | Kubota et al. |
| 2002/0008234 A1 | 1/2002 | Emrick |
| 2002/0021855 A1 | 2/2002 | Kim |
| 2002/0030246 A1 | 3/2002 | Eisenbeiser et al. |
| 2002/0047123 A1 | 4/2002 | Ramdani et al. |
| 2002/0047143 A1 | 4/2002 | Ramdani et al. |
| 2002/0052061 A1 | 5/2002 | Fitzgerald |
| 2002/0072245 A1 | 6/2002 | Ooms et al. |
| 2002/0076678 A1 | 6/2002 | Wasa et al. |
| 2002/0079576 A1 | 6/2002 | Seshan |
| 2002/0131675 A1 | 9/2002 | Litvin |
| 2002/0140012 A1 | 10/2002 | Droopad |
| 2002/0145168 A1 | 10/2002 | Bojarczuk, Jr. et al. |
| 2002/0179000 A1 | 12/2002 | Sakurai et al. |
| 2002/0195610 A1 | 12/2002 | Klosowiak |

FOREIGN PATENT DOCUMENTS

| | | |
|---|---|---|
| DE | 197 12 496 | 10/1997 |
| DE | 198 29 609 | 1/2000 |
| DE | 100 17 137 | 10/2000 |
| EP | 0 247 722 | 12/1987 |
| EP | 0 250 171 | 12/1987 |
| EP | 0 300 499 | 1/1989 |
| EP | 0 309 270 | 3/1989 |
| EP | 0 331 338 | 9/1989 |
| EP | 0 331 467 | 9/1989 |
| EP | 0 342 937 | 11/1989 |
| EP | 0 392 714 | 10/1990 |
| EP | 0 412 002 | 2/1991 |
| EP | 0 455 526 | 6/1991 |
| EP | 0 483 993 | 5/1992 |
| EP | 0 494 514 | 7/1992 |
| EP | 0 514 018 | 11/1992 |
| EP | 0 538 611 | 4/1993 |
| EP | 0 581 239 | 2/1994 |

| | | |
|---|---|---|
| EP | 0 600 658 | 6/1994 |
| EP | 0 602 568 | 6/1994 |
| EP | 0 607 435 | 7/1994 |
| EP | 0 614 256 | 9/1994 |
| EP | 0 619 283 | 10/1994 |
| EP | 0 630 057 | 12/1994 |
| EP | 0 661 561 | 7/1995 |
| EP | 0 860 913 | 8/1995 |
| EP | 0 682 266 | 11/1995 |
| EP | 0 711 853 | 5/1996 |
| EP | 0 766 292 | 4/1997 |
| EP | 0 777 379 | 6/1997 |
| EP | 0 810 666 | 12/1997 |
| EP | 0 828 287 | 3/1998 |
| EP | 0 852 416 | 7/1998 |
| EP | 0 875 922 | 11/1998 |
| EP | 0 881 669 | 12/1998 |
| EP | 0 884 767 | 12/1998 |
| EP | 0 926 739 | 6/1999 |
| EP | 0 957 522 | 11/1999 |
| EP | 0 964 259 | 12/1999 |
| EP | 0 964 453 | 12/1999 |
| EP | 0 993 027 | 4/2000 |
| EP | 0 999 600 | 5/2000 |
| EP | 1 001 468 | 5/2000 |
| EP | 1 035 759 | 9/2000 |
| EP | 1 037 272 | 9/2000 |
| EP | 1 043 426 | 10/2000 |
| EP | 1 043 427 | 10/2000 |
| EP | 1 043 765 | 10/2000 |
| EP | 1 054 442 | 11/2000 |
| EP | 1 069 605 | 1/2001 |
| EP | 1 069 606 | 1/2001 |
| EP | 1 085 319 | 3/2001 |
| EP | 1 089 338 | 4/2001 |
| EP | 1 109 212 | 6/2001 |
| EP | 1 176 230 | 1/2002 |
| FR | 2 779 843 | 12/1999 |
| GB | 1 319 311 | 6/1970 |
| GB | 2 152 315 | 7/1985 |
| GB | 2 335 792 | 9/1999 |
| JP | 52-88354 | 7/1977 |
| JP | 52-89070 | 7/1977 |
| JP | 52-135684 | 11/1977 |
| JP | 54-134554 | 10/1979 |
| JP | 55-87424 | 7/1980 |
| JP | 58-075868 | 5/1983 |
| JP | 58-213412 | 12/1983 |
| JP | 59-044004 | 3/1984 |
| JP | 59-073498 | 4/1984 |
| JP | 59066183 | 4/1984 |
| JP | 60-161635 | 8/1985 |
| JP | 60-210018 | 10/1985 |
| JP | 60-212018 | 10/1985 |
| JP | 61-36981 | 2/1986 |
| JP | 61-63015 | 4/1986 |
| JP | 61-108187 | 5/1986 |
| JP | 62-245205 | 10/1987 |
| JP | 63-34994 | 2/1988 |
| JP | 63-131104 | 6/1988 |
| JP | 63-198365 | 8/1988 |
| JP | 63-289812 | 11/1988 |
| JP | 64-50575 | 2/1989 |
| JP | 64-52329 | 2/1989 |
| JP | 1-102435 | 4/1989 |
| JP | 1-179411 | 7/1989 |
| JP | 01-196809 | 8/1989 |
| JP | 03-149882 | 11/1989 |
| JP | HEI 2-391 | 1/1990 |
| JP | 02051220 | 2/1990 |
| JP | 3-41783 | 2/1991 |
| JP | 03046384 | 2/1991 |
| JP | 3-171617 | 7/1991 |
| JP | 03-188619 | 8/1991 |
| JP | 5-48072 | 2/1993 |
| JP | 5-086477 | 4/1993 |
| JP | 5-152529 | 6/1993 |
| JP | 05150143 | 6/1993 |
| JP | 05 221800 | 8/1993 |
| JP | 5-232307 | 9/1993 |
| JP | 5-238894 | 9/1993 |
| JP | 5-243525 | 9/1993 |
| JP | 5-291299 | 11/1993 |
| JP | 06-069490 | 3/1994 |
| JP | 6-232126 | 8/1994 |
| JP | 6-291299 | 10/1994 |
| JP | 6-334168 | 12/1994 |
| JP | 0812494 | 1/1996 |
| JP | 9-67193 | 3/1997 |
| JP | 9-82913 | 3/1997 |
| JP | 10-256154 | 9/1998 |
| JP | 10-269842 | 10/1998 |
| JP | 10-303396 | 11/1998 |
| JP | 10-321943 | 12/1998 |
| JP | 11135614 | 5/1999 |
| JP | 11-238683 | 8/1999 |
| JP | 11-260835 | 9/1999 |
| JP | 01 294594 | 11/1999 |
| JP | 11340542 | 12/1999 |
| JP | 2000-068466 | 3/2000 |
| JP | 2 000 1645 | 6/2000 |
| JP | 2000-278085 | 10/2000 |
| JP | 2000-349278 | 12/2000 |
| JP | 2000-351692 | 12/2000 |
| JP | 2001-196892 | 7/2001 |
| JP | 2002-9366 | 1/2002 |
| WO | WO 92/10875 | 6/1992 |
| WO | WO 93/07647 | 4/1993 |
| WO | WO 94/03908 | 2/1994 |
| WO | WO 95/02904 | 1/1995 |
| WO | WO 97/45827 | 12/1997 |
| WO | WO 98/05807 | 1/1998 |
| WO | WO 98/20606 | 5/1998 |
| WO | WO 99/14797 | 3/1999 |
| WO | WO 99/14804 | 3/1999 |
| WO | WO 99/19546 | 4/1999 |
| WO | WO 99/63580 | 12/1999 |
| WO | WO 99/67882 | 12/1999 |
| WO | WO 00/06812 | 2/2000 |
| WO | WO 00/16378 | 3/2000 |
| WO | WO 00/33363 | 6/2000 |
| WO | WO 00/48239 | 8/2000 |
| WO | WO 01/04943 A1 | 1/2001 |
| WO | WO 01/16395 | 3/2001 |
| WO | WO 01/33585 | 5/2001 |
| WO | WO 01/37330 | 5/2001 |
| WO | WO 01/59814 A2 | 8/2001 |
| WO | WO 01/59820 A1 | 8/2001 |
| WO | WO 01/59821 A1 | 8/2001 |
| WO | WO 01/59837 | 8/2001 |
| WO | WO 02 01648 | 1/2002 |
| WO | WO 02/03113 | 1/2002 |
| WO | WO 02/03467 | 1/2002 |
| WO | WO 02/03480 | 1/2002 |
| WO | WO 02/08806 | 1/2002 |
| WO | WO 02/009150 | 1/2002 |
| WO | WO 02/09160 A2 | 1/2002 |
| WO | WO 02/11254 | 2/2002 |
| WO | WO 02/33385 A2 | 4/2002 |
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

Nakagawara et al., Effects of Buffer Layers in Epitaxial Growth of $SrTiO_3$ Thin Film on Si(100), *J. Appl. Phys.*, 78(12), Dec. 15, 1995, pp. 7226-7230.

Suzuki et al., "A Proposal of Epitaxial Oxide Thin Film Structures For Future Oxide Electronics," *Materials Science and Engineering B41*, (1996), pp. 166-173.

W. F. Egelhoff et al., "Optimizing GMR Spin Valves: The Outlook for Improved Properties", *1998 Int'l Non Volatile Memory Technology Conference*, pp. 34-37.

Wang et al., "Processing and Performance of Piezoelectric Films", Univ. of MD, Wilcoxon Research Col, and Motorola Labs, May 11, 2000.

M. Rotter et al., "Nonlinear Acoustoelectric Interactions in $GaAs/LiNbO_3$ Structures", *Applied Physics Letters*, vol. 75(7), Aug. 16, 1999, pp. 965-967.

K. Sreenivas et al., "Surface Acoustic Wave Propagation on Lead Zirconate Titanate Thin Films," *Appl. Phys. Lett.* 52 (9), Feb. 29, 1988, pp. 709-711.

M. Rotter et al., "Single Chip Fused Hybrids for Acousto-Electric and Acousto-Optic Applications," *1997 Applied Physics Letters*, vol. 70(16). Apr. 21, 1997, pp. 2097-2099.

A. Mansingh et al., "Surface Acoustic Wave Propagation in $PZT/YBCO/SrTiO_3$ and $PbTiO_3/YBCO/SrTiO_3$ Epitaxial Heterostructures," *Ferroelectric*, vol. 224, pp. 275-282, 1999.

S. Mathews et al., "Ferroelectric Field Effect Transistor Based on Epitaxial Perovskite Heterostructures", *Science*, vol. 276, Apr. 11, 1997, pp. 238-240.

R. Houdre et al., "Properties of GaAs on Si Grown by Molecular Beam Epitaxy," *Solid State and Materials Sciences*, vol. 16, Issue 2, 1990, pp. 91-114.

S. F. Fang et al., "Gallium Arsenide and Other Compound Semiconductors on Silicon," *J. Appl. Phys.*, 68(7), Oct. 1, 1990, pp. R31-R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884-1886.

Ringel et al., "Epitaxial Integration of III-V Materials and Devices with Si Using Graded GeSi Buffers," 27th International Symposium on Compound Semiconductors, Oct. 2000.

Zogg et al., "Progress in Compound-Semiconductor-on-Silicon-Heteroepitaxy with Fluoride Buffer Layers," *J. Electrochem Soc.*, vol. 136, No. 3, Mar. 1998, pp. 775-779.

Xiong et al., "Oxide Defined GaAs Vertical-Cavity Surface-Emitting Lasers on Si Substrates," *IEEE Photonics Technology Letters*, vol. 12, No. 2, Feb. 2000, pp. 110-112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661-666, 1999.

Gunapata et al., "Bound-To-Quasi-Bound Quantum-Well Infrared Photodetectors," NASA Tech Brief, vol. 22, No. 9, Sep. 1998.

Abhay M. Joshi et al., "Monolithic InGaAs-on-silicon Wave Infrared Detector Arrays," *Intn. Society for Optical Engineering*, vol. 2999, pp. 211-224.

Bruley et al., "Nanostructure and Chemistry of a (100)MgO/ (100) GaAs Interface," *Appl. Phys. Lett*, 65(5), Aug. 1994, pp. 564-566.

Fork et al., "Epitaxial MgO On Si(001) for Y-Ba-Cu-O Thin Film Growth by Pulsed Laser Deposition," *Appl. Phys. Lett.*, 58(20), May 20, 1991, pp. 2294-2296.

Himpsel et al., "Dialectrics on Semiconductors," *Materials Science and Engineering*, B1(1988), pp. 9-13.

Li et al., "Epitaxial La $_{0.67}Sr_{0.33}MnO_3$ Magnetic Tunnel Junctions," *J. Appl. Phys.* 81(8), Apr. 15, 1997, pp. 5509-5511.

O'Donnell et al., "Colossal Magnetoresistance Magnetic Tunnel Junctions Grown by Molecular-Beam Epitaxy," *Appl. Physics Letters*, vol. 76, No. 14, Apr. 3, 2000, pp. 1914-1916.

Mikami et al., "Formation of Si Epi/MgO-$Al_2O_3$Epi./$SiO_3$/ Si and its Epitaxial Film Quality," Fundamental Research Laboratories and Microelectronics Laboratories, pp. 31-34, 1983.

T. Asano et al., "An Epitaxial Si/Insulator/Si Structure Prepared by Vacuum Deposition of $CaF_2$ and Silicon," *Thin Solid Films*, vol. 93 (1982), pp. 143-150.

T. Chikyow et al., "Reaction and Regrowth Control of $CeO_2$ on Si(111) Surface for the Silicon-On-Insulator Structure," *Appl. Phys. Lett.*, vol. 65, No. 8, Aug. 22, 1994, pp. 1030-1032.

J.F. Kang, et al., "Epitaxial Growth of $CeO_2$(100) Films on Si(100) Substrates by Dual Ion Beams Reactive Sputtering," *Solid State Communications*, vol. 108, No. 4, pp. 225-227, 1998.

R.A. Morgan et al., "Vertical-Cavity Surface-Emitting Lasers Come of Age," *SPIE*, vol. 2683, pp. 18-29.

"Technical Analysis of Qualcomm QCP-800 Portable Cellular Phone (Transmitter Circuitry)," Talus Corporation, Qualcomm QCP-800 Technical Analysis Report, Dec. 10, 1996, pp. 5-8.

Jo-Ey Wong, et al.; "An Electrostatically-Actuated MEMS Switch for Power Applications"; IEEE, 2000; pp. 633-638.

T. Mizuno, et al.; "Electron and Hole Mobility Enhancement in Strained-Si MOSFET's on SiGe-on-Insulator Substrates Fabricated by SIMOX Technology"; IEEE Electron Device Letters, vol. 21. No. 5, May 2000; pp. 230-232.

F.M. Buffer, et al.; "Strain-dependence of electron transport in bulk Si and deep-submicron MOSFET's" Computatural Electronics, 2000, Book of Abstracts, IWCE Glasgow 2000, 7th Int'l Workshop on, 2000; pp. 64-65.

S.S. Lu, et al.; "Piezoelectric field effect transistor (PEFET) using $In_{0.2}Ga_{0.85}As/In_{0.2}Ga_{0.8}As/GaAs$ Strained layer structure on (111)B GaAs substrate"; Electronics Letters, 12TH Ma 1994, vol. 30, No. 10; pp. 823-825.

Kihong Kim, et al. "On-Chip Wireless Interconnection with Integrated Antennas"; 2000 IEEE; pp. 20.2.1-20.3.4.

G. Passiopoulos, et al.; "V-Band Single Chip, Direct Carrier BPSK Modulation Transmitter With Integrated Patch Antenna"; 1998 IEEE MTT-S Digest; pp. 305-308.

Mau-Chung Frank Chang, et al.; "RF/Wireless Interconnect for Inter- and Intra-Chip Communications"; Proceedings of the IEEE, vol. 89, No. 4, Apr. 2001; pp. 456-465.

The Electronics Industry Report; Prismark; 2001; pp. 111-120.

J.K. Abrokwah, et al.; "A Manufacturable Complementary GaAs Process"; GaAs IC Symposium, IEEE, 1993; pp. 127-130.

H. Nagata. "A Preliminary Consideration of the Growth Behaviour of $CeO_2$, $SrTiO_2$ and $SrVO_3$ Films on Si Substrate," *Thin Solid Films*, 224, 1993, pp. 1-3.

Nagata et al., "Heteroepitaxial Growth of $CeO_2$(001) Films on Si(001) Substrates by Pulsed Laser Deposition in Ultrahigh Vacuum," *Jpn. Jour. Appl. Phys.*, vol. 30, No. 68, Jun. 1991, pp. L1136-L1138.

Kado et al., "Heteroepitaxial Growth of SrO Films on Si Substrates," *J. Appl. Phys.*, 61(6), Mar. 15, 1987, pp. 2398-2400.

H. Ishiwara et al., "Epitaxial Growth of Perovskite Type Oxide Films on Substrates"; *Materials Research Symposium Proceedings*, vol. 220, pp. 595-600, Apr. 29-May 3, 1991.

J.K. Abrokwah, et al.; "A Manufacturable High-Speed Low-Power Complementary GaAs Process"; Extended Abstracts of the 1994 International Conference on Solid State Devices and Materials, Yokohama, 1994, pp. 592-594.

C.J. Palmstrom et al.; "Stable and Epitaxial Contacts to III-V Compound Semiconductors"; Contacts to Semiconductors Fundamentals and Technology; Noyles Publications, 1993; pp. 67-150.

Jayshri Sabarinathat, et al.; "Submicron three-dimensional infrared GaAs/Al$_x$O$_y$-based photonic crystal using single-step epitaxial growth"; Applied Physics Letters, vol. 78, No. 20, May 14, 2001; pp. 3024-3026.

Philip Ball; "The Next Generation of Optical Fibers"; Technology Review, May 2001; pp. 55-61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51-96.

G. H. Jin, et al.; "PLZT Film Waveguide Mach-Zehnder Electrooptic Modulator"; Journal of Lightwave Technology, vol. 18, No. 6, Jun. 2000; pp. 807-812.

D.E. Aspnes, et al.; "Steps on (001) silicon surfaces"; J. Vac. Sci. Technol. B, vol. 5, No. 4, Jul./AUg. 1987; pp. 939-944.

D.M. Newns, et al.; "Mott transition field effect transistor"; Applied Physics Letters, vol. 73, No. 6, Aug. 10, 1998; pp. 780-782.

Lucent Technologies, Inc. "Arrayed Waveguide Grating Multiplexer/Demultiplexer"; Jan. 2000; 4 pages.

Hisashi Shichijo, et al.; "Co-Integration of GaAs MESFET and Si CMOS Circuits"; IEEE Electron Device Letters, vol. 9, No. 9, Sep. 1988; pp. 444-446.

H. Shichijo, et al.; "GaAs MESFET and Si CMOS Cointegration and Circuit Techniques"; 1998 IEEE; GaAs IC Symposium 239-242.

H. Shichijo, et al.; "Monolithic Process for Co-Integration of GaAs and Silicon Circuits"; 1988 IEEE; pp. 778-781.

Z.H. Zhu, et al. "Growth of InGaAs multi-quantum wells at 1.3 m wavelength on GaAs compliant substrates"; Applied Physics Letters, vol. 72, No. 20, May 18, 1998; pp. 2598-2600.

Kurt Eisenbeiser, et al.; "Metamorphic InAlAs/InGaAs Enhancement Mode HEMT's on GaAs Substrates"; IEEE Electron Device Letters, vol. 20, No. 10, Oct. 1999; pp. 507-509.

Tomonori Nagashima, et al.; "Three-Terminal Tandem Solar Cells With a Back-Contact Type Bottom Cell" Higashifuji Technical Center, Toyota Motor Corporation: 4 pages.

James Schellenberg, et al.; "Low-Loss, Planar Monolithic Baluns for K/Ka-Band Applications"; 1999 IEEE MTT-S Digest; pp. 1733-1736.

Arnold Leitner et al; "Pulsed Laser Deposition of Superconducting Strontium Titanate Thin-Films"; ; Session K11-Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AlN films on -Al$_2$O$_3$, Si and 6H-SiC by pulsed laser deposition"; Thin Solid Films 299 (1997), pp. 94-103.

T. Warren Weeks, et al.; "GaN thin films deposited via organometallic vapor phase epitaxy on (6H)-SiC(001) using high-temperature monocrystalline AlN buffers layers" 320 Applied Physics Letters, vol. 67, No. 3, Jul. 17, 1995, pp1401-403.

Z. Yu, et al; "Epitaxial oxide thin films on SI(001)"; J. Vac. Sci. Technol. B. vol. 18, No. 4, Jul./Aug. 2000; pp. 2139-2145.

Gentex Corporate Website; Photoelectric Smoke Detectors—How They Work; 2001.

Jeffrey B. Casady, et al.; "A Hybrid 6H-SiC Temperature Sensor Operational from 25 C to 500 C"; IEEE Transactions on Components, Packaging, and Manufacturing Technology—Part A, vol. 19, No. 3, Sep. 1996; pp. 416-422.

Ronald W. Waynant, et al.; "Optoelectronic Integrated Circuits"; Electro-Optics Handbook, McGraw-Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37-42.

D.A. Francis, et al.; "A single-chip linear optical amplifier"; OFC, 2001; Mar. 17-22, 2001.

G. Vogg et al.; "Epitaxial alloy films of zinti-phase Ca(Si1-xGex)2"; Journal of Crystal Growth 223 (2001): pp. 573-576.

Peter S. Guilfoyle, et al.; "Optoelectronic Architecture for High-Speed Switching and Processing Applications"; 1998 The Photonics Design and Applications Handbook; pp. H-399-H-406.

Gerald B. Stringfellow; "Organometallic Vapor-Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer-Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, p. 655-656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of SrTiO$_3$ Films on Silicon Substrates," *Japan J of Appl. Phys.*, vol. 33, Mar. 1994, pp. 1472-1477.

Yodo et al., GaAs Heteroepitaxial Growth on Si Substrates with Thin Si Interlayers *in situ* Annealed at High Temperatures, 8257b *Journal of Vacuum Science & Technology*, May/Jun. 1995, vol. 13, No. 3, pp. 1000-1005.

Cuomo et al., "Substrate Effect on the Superconductivity of YBa$_2$Cu$_3$O$_7$ Thin Films," AIP Conference 1988, pp. 141-148.

McKee et al., "Crystalline Oxides on Silicon: The First Five Monolayers," *Physical Review Letters*, vol. 81, No. 14, Oct. 1998, pp. 3014-3017.

McKee et al., "Molecular Beam Epitaxy Growth of Epitaxial Barium Silicide, Barium Oxide, and Barium Titanate on Silicon," *1991 American Institue of Physics*, pp. 782-784, Aug. 13, 1991.

Tambo et al., Molecular Beam Epitaxy Growth of SrTiO$_3$ Films on Si(100)-2x1 with SrO Buffer Layer, *Jpn. J. Appl. Phys.*, vol. 37, 1998, pp. 4454-4459.

McKee et al., "The MBE Growth and Optical Qualtiy of BaTiO$_3$ and SrTiO$_3$ Thin Films on MgO," *Mat. Res. Soc. Symp. Proc.*, vol. 341, Apr. 1994, pp. 309-314.

McKee et al., "BaSi₂ and Thin Film Alkaline Earth Silicides on Silicon," *Appl. Phys. Lett.*, 63 (20), Nov. 1993, pp. 2818-2820.

McKee et al., "Surface Structures and the Orthorhombic Transformation of Thin Film $BaSi_2$ on Silicon," *Mat. Res. Soc. Symp. Proc.*, vol. 221, pp. 131-136.

Brian A. Floyd, et al.; "The projected Power Consumption of a Wireless Clock Distribution System and Comparison to Conventional Distribution Systems"; IEEE, 1999; pp. IITC99-249-IITC99-250.

Mori et al., "Epitaxial Growth of $SrTiO_3$ Films on Si(100) Substrates Using a Focused Electron Beam Evaporation Method," *Jpn. J. of Appl. Phys.*, vol. 30, No. 8A, Aug. 1991, pp. L1415-L1417.

Moon et al., "Growth of Crystalline $SrTiO_3$ Films on Si Substrates Using Thin Fluoride Buffer Layers and Their Electrical Properties," *Jpn. J. of Appl. Phys.*, vol. 33, (1994), pp. 5911-5916.

Farrow et al., "Heteroepitaxy of Dissimilar Materials," *Mat. Res. Soc. Symposium Proceedings*, vol. 221, pp. 29-34, Apr. 29-May 2, 1991.

Ishiwara et al., "Heteroepitaxy on Silicon: Fundamentals, Structure, and Devices," *Mat. Res. Soc.*, Symposium Proceedings, vol. 116, pp. 369-374, Apr. 5-8, 1988.

Douglas B. Chrisey, et al; Pulsed Laser Deposition of Thin Films; pp. 273-285.

B.A. Block, et al; "Photoluminescence properties of $Er^3$-doped $BaTiO_3$ thin films"; Appl. Phys. Lett. 65 (1), Jul. 4, 1994, pp. 25-27.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60-63, XP010210167.

Wenhua Zhu et al.; "Molecular Beam Epitaxy of GaAs on Si-on-Insulator"; 320 Applied Physics Letters 59(1991) Jul. 8 No. 2; pp. 210-212.

Umesh K. Mishra et al; "Oxide Based Compound Semiconductor Electronics"; Electron Devices Meeting; 1997, Technical Digest, International; Washington, D.C.; Dec. 7-10, 1997; pp. 545-548.

J.M. Daughton et al.; "Applications of Spin Dependent Transport Materials"; J. Phys. D. Appl. Phys. 32(1999) R169-R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143-14146.

Q.-Y. Tong et al.; "IOS-a new type of materials combination for system-on-a chip preparation"; 1999 IEEE International SOI Conference, Oct. 1999; pp. 104-105.

T. Kannlainen et al.; "Growth of Dielectric 1hfo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36-46.

Myung Bok Lee; "Heteroepitaxial Growth of $BaTio_3$ Films on Si by Pulsed Laser Deposition"; Applied Physics Letters; Mar. 13, 1995; pp. 1331-1333.

Myung Bok Lee; "Formation and Characterization of Epitaxial $TiO_2$ and $BaTiO_3/TiO_3$ Films on Si Substrate"; Japan Journal Applied Physics Letters; vol. 34; 1995; pp. 808-811.

Gilbert Lecarpentier et al.; "High Accuracy Machine Automated Assembly for Opto Electronics"; 2000 Electronic Components and Technology Conference; pp. 1-4.

R. Ramesh; "Ferroelctric La-Sr-Co-O/Pb-Zr-Ti-O/La-Sr-Co-O Heterostructures on Silicon via Template Growth"; 320 Applied Physics Letters; 63(1993); Dec. 27; No. 26; pp. 3592-3594.

K. Eisenbeiser; "Field Effect Transistors with $SrTiO_3$ Gate Dielectric on Si"; Applied Physics Letters; vol. 76, No. 10; Mar. 6, 2000; pp. 1324-1326.

Stephen A. Mass; "Microwave Mixers"; Second Edition; 2pp.

Douglas J. Hamilton et al.; "Basic Integrated Circuit Engineering "; pp. 2; 1975.

Takeshi Obata: "Tunneling Magnetoresistance at Up to 270 K in $La_{0.6}Sr_{0.2}MnO_3SrTiO_3/La_{0.6}Sr_{0.2}MnO_3$ Junctions with 1.6-nm-Thick Barriers"; Applied Physics Letters; vol. 74, No. 2; Jan. 11, 1999; pp. 290-292.

Wei Zhang et al.; "Enhanced Magnetoresistance in La-Ca-Mn-O Films on Si Substrates Using $YbaCuO/CeO_2$ Heterostructures"; Physica C: vol. 282-287, No. 2003; Aug. 1, 1997; pp. 1231-1232.

Shogo Imada et al; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497-6501; Part 1, No. 12A, Dec. 1998.

Ladislav Pust et al.; "Temperature Dependence of the Magnetization Reversal in Co(fcc)-BN-Co(poly hcp) Structures"; Journal of Applied Physics; vol. 85, No. 8; Apr. 15, 1999; pp. 5765-5767.

C. Martinez; "Epitaxial Metallic Nanostructures on GaAs"; Surface Science; vol. 482-485; pp. 910-915; 2001.

Wen-Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305-316.

Zhu Dazhong et al.; "Design of $AnO/SiO_2/Si$ Monolithic Integrated Programmable SAW Filter"; Proceedings of Fifth International Conference on Solid-State and Integrated Circuit Technology; 21-23; Oct. 1998; pp. 826-829.

Kirk-Othmer Encyclopedia of Chemical Technology; Fourth Edition, vol. 12; Fuel Resources to Heat Stabilizers; A Wiley-Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAIAs MODFETs and RTDs on InP-bonded-to-Si Substrate"; Fourth International Conference on Indium Phosphide and Related Materials, Newport, RI, USA; Apr. 21-24, 1992; pp. 167-170; XP000341253; IEEE, New York, NY, USA; ISBN: 0-7803-0522-1.

H. Takahashi et al.; "Arrayed-Waveguide Grating For Wavelength Division Multi/Demultiplexer With Nanometre REsolution"; Electronics Letters; vol. 26., No. 2, Jan. 18th, 1990.

Pierret, R.F.; "1/J-FET and MESFET"; Field Effect Devices; MA, Addison-Wesley; 1990; pp. 9-22.

M. Schreiter, et al.; "Sputtering of Self-Polarized PZT Films for IR-Detector Arrays"; 1998 IEEE; pp. 181-185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366-369.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society: pp. 109-114.

Wang et al.; "Depletion-Mode GaAs MOSFETs with Negligible Drain Current Drift and Hysteresis"; Electron Devices Meeting, 1998, IEDM '98 Technical Digest; pp. 67-70.

Ben G. Streetman; "Solid State Electronic Devices"; 1990, Prentice Hall; Third Edition; pp. 320-322.

A.Y Wu et al.; "Highly Oriented (Pb,La)(Zr,Ti)$O_3$ Thin Films on Amorphous Substrates"; IEEE, 1992; pp. 301-304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321-326.

S.N. Subbarao et al.; "Monolithic PIN Photodetector and FET Amplifier on GaAs-os-Si"; IEEE; GaAs IC Symposium-163-166; 1989.

T.A. Langdo et al.; "High Quality Ge on Si by Epitaxial Necking"; Applied Physics Letters; vol. 76, No. 25; pp. 3700-3702; Jun. 19, 2000.

Chenning Hu et al.; Solar Cells From Basics to Advanced Systems; McGraw-Hill Book Company; 1983.

O.J. Painter et al; "Room Temperature Photonic Crystal Defect Lasers at Near-Infrared Wavelengths in inGaAsp"; Journal of Lightwave Technology, vol. 17, No. 11; Nov. 1999.

C. Donn et al.; "A 16-Element, K-Band Monolithic Active Receive Phased Array Antenna"; Antennas and Propagation Society International Symposium, 1988; pp. 188-191, vol. 1; Jun. 6-10, 1988.

Don W. Shaw; "Epitaxial GaAs on Si; Progress and Potential Applications"; Mat. Res. Soc. Symp. Proc.; pp. 15-30; 1987.

G.J.M. Dormans, et al.; "PbTiO/$_3$/Thin Films Grown by Organometallic Chemical Vapour Deposition"; Third International Symposium on Integrated Ferroelectrics; Apr. 3-5, 1991 (Abstract).

P.J. Borrelli et al.; "Compositional and Structural Properties of Sputtered PLZT Thin Films"; Ferroelectric Thin Films II Symposium; Dec. 2-4, 1991 (Abstract).

Ranu Nayak et al; "Enhanced acousto-optic diffraction efficiency in a symmetric SrRIO3/BaTiO3/SrTiO3 thin-film heterostructure"; Nov. 1, 2000; vol. 39, No. 31; Applied Optics; pp. 5847-5853.

Ranu Nayak et al; "Studies on acousto-optical interaction in SrTiO3/BaTiO3/SrTiO3 epitaxial thin film heterostructures"; J. Phys. D: Appl. Phys/ 32 (1999) 380-387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358-367.

V. Kaushik et al.; "Device Characteristics of Crystalline Epitaxial Oxides on Silicon"; Device Research Confernece, 2000; Conference Digest 58th DRC; pp. 17-20; Jun. 19-21, 2000.

Katherine Derbyshire; "Prospects Bright for Optoelectronics Volume, Cost Drive Manufacturing for Optical Applications"; Semiconductor Magazine: vol. 3, No. 3: Mar. 2002

Alex Chediak et al; "Integration of GaAs/Si with Buffer Layers and Its Impact on Device Integration"; TICS 4, Prof. Sands. MSE 225, Apr. 12, 2002; pp. 1-5.

S.A. Chambers et al; "Band Discontinuities at Epitaxial SrTiO3/Si(001) Heterojunctions"; Applied Physics Letters; vol. 77, No. 11; Sep. 11, 2000; pp. 1662-1664.

H. Wang et al.; "GaAs/GaAIAs power HBTs for Mobile Communications"; Microwave Symposium Digest; 1993 IEEE; vol. 2; pp. 549-552.

Y. Ota et al.; "Application of Heterojunction FET to Power Amplifier for Cellular Telephone"; Electronics Letters; May 26th 1994; vol. 30, No. 11; pp. 906-907.

Keiichi Sakuno et al; "A 3.5W HBT MMIC Power Amplifier Module for Mobile Communications"; IEEE 1994; Microwave and Millimeter-Wave Monolithic Circuits Symposium; pp. 63-66.

Mitsubishi Semiconductors Press Release (GaAs FET's) Nov. 8, 1999 pp. 1-2.

R.J. Matyi et al; "Selected Area Heteroepitaxial Growth of GaAs on Silicon for Advanced Device Structures"; 2194 Thin Solid Films; 181 (1989) Dec. 10; No. 1; No. 1; pp. 213-225.

X. Nashimoto et al; "Patterning of Nb, LaOnZr, TiO3 Waveguides for Fabricating Micro-Optics Using Wet Etching and Solid-Phase Epitaxy"; Applied Physics Letters; vol. 75, No. 8; Aug. 23, 1999; pp. 1054-1056.

Bang-Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837-840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room-Temperature Ferromagnetism in Transparent Transition Metal-Doped Titanium Dioxide"; Science; Feb. 2, 2001; vol. 291; pp. 854-856.

S.A. Chambers et al.; "Epitaxial Growth and Properties of Ferromagnetic Co-Doped TiO2 Anatase"; Applied Physics Letters; vol. 79, No. 21; Nov. 19, 2001; pp. 3467-3469.

Charles Kittel: "Introduction to Solid State Physics"; John Wiley & Sons, Inc. Fifth Edition: pp. 415.

Chyuan-Wei Chen et al: "Liquid-phase epitaxial growth and characterization of InGaAsP layers grown on GaAsP substrates for application to orange light-emitting diodes"; 931 Journal of Applied Physics; 77 (1995) Jan. 15, No. 2: Woodbury, NY, US; pp. 905-909.

W. Zhu et al.; "Oriented diamond films grown on nickel substrates", 320 Applied Physics Letters; 63(1993) Sep., No. 12, Woodbury, NY, US; pp. 1640-1642.

M. Schreck et al.; "Diamond/Ir/SrTiO3; A material combination for improved heteroepitaxial diamond films"; Applied Physics Letters; vol. 74, No. 5; Feb. 1, 1999; pp. 650-652.

Yoshihiro Yokota et al.; "Cathodoluminescence of boron-doped heteroepitxial diamond films on platinum"; Diamond and Related Materials 8(1999); pp. 1587-1591.

J.R. Busch et al.; "Linear Electro-Optic Response in Sol-Gel PZT Planar Waveguide"; Electronics Letters; Aug. 13th, 1992; vol. 28, No. 17; pp. 1591-1592.

R. Droopad et al.; "Epitaxial Oxide Films on Silicon; Growth, Modeling and Device Properties"; Mat. Res. Soc. Symp. Proc. vol. 619; 2000 Materials Research Society; pp. 155-165.

H. Ohkubo et al.; "Fabrication of High Quality Perovskite Oxide Films by Lateral Epitaxy Verified with RHEED Oscillation"; 2419A Int. Conf. on Solid State Devices & Materials, Tsukuba, Aug. 26-28 (1992); pp. 457-459.

Lin Li; "Ferroelectric/Superconductor Heterostructures"; Materials Science and Engineering; 29 (2000) pp. 153-181.

L. Fan et al.; "Dynamic Beam Switching of Vertical-Cavity Surface-Emitting Lasers with Integrated Optical Beam Routers"; IEEE Photonics Technology Letters; vol. 9, No. 4; Apr. 4, 1997; pp. 505-507.

Y. Q. Xu, et al.; "(Mn, Sb) dropped-Pb(Zr, Ti)03 infrared detector arrays"; Journal of Applied Physics; vol. 88, No. 2; Jul. 15, 2000; pp. 1004-1007.

Kiyoko Kato et al.; "Reduction of dislocations in InGaAs layer on GaAs using epitaxial lateral overgrowth"; 2300 Journal of Crystal Growth 115 (1991) pp. 174-179; Dec. 1991.

Peter Weiss; "Speed demon gets hooked on silicon"; Science News Online; Sep. 15, 2001; pp. 1-3.

"Motorola Develops New Super-Fast Chip"; USA Today; Sep. 4, 2001.

Lori Valigra; "Motorola Lays GaAs on Si Wafer"; AsiaBiz Tech; Nov. 2001pp. 1-3.

"Holy Grail! Motorola Claims High-Yield GaAs Breakthrough"; Micromagazine.com (no date available); pp. 1-3.

Jong-Gui Yoon; "Growth of Ferroelectric LiNbO3 Thin Film on MgO-Buffered Si by the Sol-Gel Method"; Journal of the Korean Physical Society (Proc. Suppl.); vol. 29, Nov. 1996; pp. S648-S651.

V. Bornand et al.; "Deposition of LItaO3 thin films by pyrosol process"; Thin Solid Films 304 (1997); pp. 239-244.

R. Droopad et al.; "Development of high dielectric constant epitaxial oxides on silicon by molecular beam epitaxy"; Materials Science and Engineering B87 (2001); pp. 292-296.

A.K. Sharma et al.; "Integration of Pb(Zr0.52TiO.48)O3 epilayers with Si by domain epitaxy"; Applied Physics Letters, vol. 76, No. 11; Mar. 13, 2000; pp. 1458-1460.

Dwight C. Streit et al; "High Reliability GaAs-AlGaAs HBT's by MBE with Be Base Doping and InGaAs Emitter Contacts"; 8179 Ieee Electron Device Letters; 12(1991) Sep., No. 9, New York, US.

C. Y. Hung et al; "Piezoelectrically induced stress tuning of electro-optic devices"; 320 Applied Physics Letters; 59 (1991) Dec. 30, No. 27, New York, US.

J. Piprek; "Heat Flow Analysis of Long-Wvelength VCSEls with Various DBR Materials"; University of Delaware, Materials Science, Newark, DE, 19716-3106; Oct. 31, 1994; pp. 286-287.

P. Mackowiak et al.; "Some aspects of designing and efficient nitride VCSEL resonator"; J. Phys. D; Appl. Phys. 34(2001); pp. 954-958.

M.R. Wilson et al.; GaAs-On-Si: A GaAs IC Manufacturer's Perspective; GaAs IC Symposium, IEEE, 1988; pp. 243-246.

Y. Kitano et al.; "Thin film crystal growth of BaZrO3 at low oxygen partial pressure"; Journal of Crystal Growth 243 (2002); pp. 164-169.

M.E. Hawley; et al; "Microstructural Study of Colossal Magneto-Resistive Films As a Function of Growth Temperature, As Deposited and Annealed"; 401, 1996; pp. 531-536.

Yi W. et al; "Mechanism of cleaning Si (100) surface using Sr and SrO for the growth of crystalline SrTiO/sub 2/films" Journal of Vacuum Science & Technology, vol. 20, No. 4, Jul. 2002 pp. 1402-1405.

Xiaming Hu et al; "Sr/Si template formation for the epitaxial growth of SrTiO/sub 3/on silicon" Materials Research Society Proceedings, vol. 716, 2002, pp. 261-266.

* cited by examiner

SEMICONDUCTOR DEVICE AND METHOD

This application is a Continuation of application Ser. No. 09/584,601, filed May 31, 2000 abandoned.

FIELD OF THE INVENTION

The present invention relates in general to semiconductor devices, and more particularly to transistors fabricated in high density integrated circuits.

BACKGROUND OF THE INVENTION

There currently is a need for integrated circuits with higher density and increased functionality. To meet this need, it is necessary to reduce the dimensions of the integrated circuit's transistors. For example, it is expected that future integrated circuit transistors will be fabricated with effective channel lengths of one hundred nanometers or less.

Such small transistors often suffer from fringing fields and other short channel effects which degrade performance and diminish control over the transistor's operation. To reduce the short channel effects, a thinner gate dielectric often is used. However, the thin gate dielectric often results in excessive gate leakage current, which increases power and lowers the performance of the integrated circuit.

Hence, there is a need for a transistor that has small physical dimensions but does not suffer from short channel effects or excessive gate leakage current.

BRIEF DESCRIPTION OF THE DRAWINGS

The specific objects and advantages of the present instant invention will become readily apparent to those skilled in the art from the following detailed description thereof taken in conjunction with the drawings in which.

DETAILED DESCRIPTION OF THE DRAWINGS

In the figures, elements having the same reference numbers have similar functionality.

Figure 1:
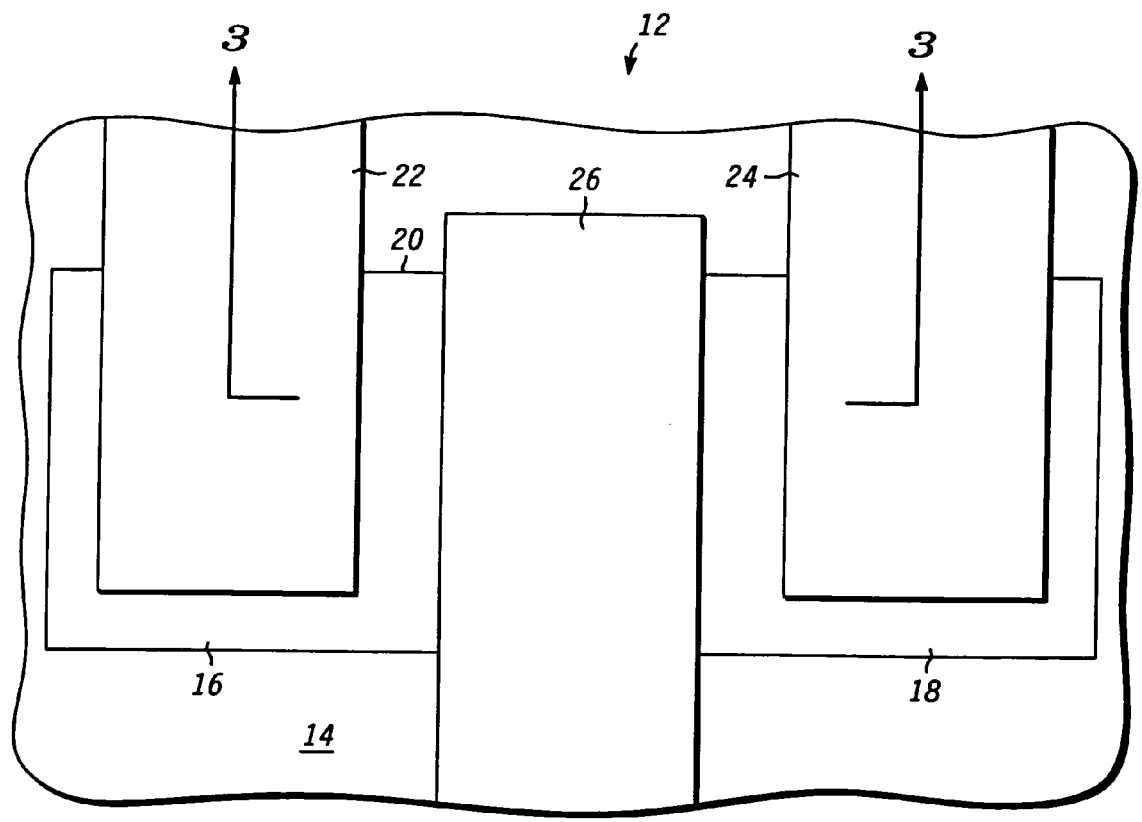
FIG. 1 is a top view of a portion of an integrated circuit.

FIG. 1 is a top view of an integrated circuit 10, showing a transistor 12 formed on a semiconductor substrate 14. In the embodiment of FIG. 1, transistor 12 is an N-channel metal-oxide-semiconductor transistor. Transistor 12 includes a drain 16, a source 18 and a gate 20, which are coupled to other devices (not shown) of integrated circuit 10 with interconnect lines 22, 24 and 26, respectively.

Substrate 14 typically is formed from silicon. Alternatively, another semiconductor material may be used, such as gallium arsenide, germanium, and the like.

Figure 2:
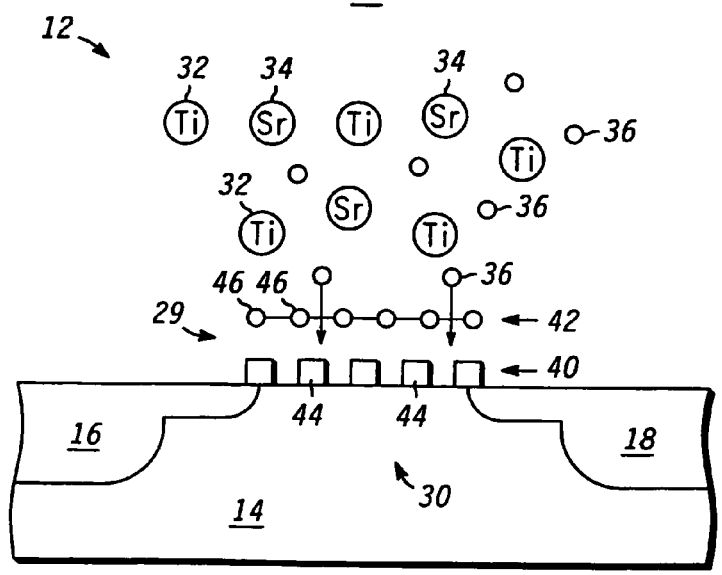
FIG. 2 shows a cross-sectional view of the integrated circuit at a processing step where a transistors gate dielectric is being fabricated.

FIG. 2 is a cross-sectional view of integrated circuit 10 during a step of the fabrication of a dual layer gate dielectric 29 over a channel region 30 of transistor 12. Portions of substrate 14 are doped with an N-type impurity such as phosphorous or arsenic to form drain 16 and source 18 as shown. The distance from drain 16 to source 18 typically is one hundred nanometers or less.

Gate dielectric 29 includes an amorphous layer 40 typically comprising silicon dioxide. Gate dielectric 29 further includes a crystalline layer 42 typically comprising strontium titanate ($SrTiO_3$). Here it should be noted that crystalline layer 42 is generally grown as a single crystal (monocrystalline) structure whereas amorphous layer 40 is generally referred to as a layer with no short or long range ordering.

Integrated circuit 10 is shown as placed in a chamber of a molecular beam epitaxial (MBE) reactor or similar apparatus. An atmosphere of gaseous titanium (Ti) atoms 32, strontium (Sr) atoms 34 and oxygen ($O_2$) molecules 36 is formed in the MBE reactor at an ambient temperature between 400 and 600 degrees Celsius and a pressure of between $10^{-9}$ and $10^{-5}$ millibars. A titanium cell (not shown) is locally heated to a temperature of about 1,750 degrees Celsius to vaporize the titanium to produce titanium atoms 32. A strontium cell (not shown) is heated to a temperature of about 450 degrees Celsius to produce strontium atoms 34. Strontium atoms 34 and titanium atoms 32 are generated in approximately stoichiometric proportions for forming crystalline strontium titanate. Oxygen molecules 36 are supplied in an excess of stoichiometric proportions by operating an oxygen source (not shown) at an overpressure of approximately $10^{-6}$ millibars.

The titanium atoms 32, strontium atoms 34 and oxygen molecules 36 react to form strontium titanate molecules 46. Under the described conditions, strontium titanate molecules grow in a crystalline fashion to form crystalline layer 42. A first molecular layer of crystalline layer 42 is shown in FIG. 2 as open circles connected with lines to represent crystallized strontium titanate molecules 46 and their intermolecular binding forces. Further reaction leads to additional molecular layers of strontium titanate being crystallized over the first molecular layer.

Oxygen molecules 36 are present in greater than stoichiometric proportions, so that excess oxygen is available to diffuse through crystalline layer 42 to react with silicon atoms of substrate 14. The reaction produces silicon dioxide molecules 44, represented in FIG. 2 as squares, overlying the surface of substrate 14. Silicon dioxide molecules 44 grow in a non-crystalline fashion to form amorphous layer 40.

As a feature of the present invention, amorphous layer 40 is grown while crystalline layer 42 is being grown. Hence, only one thermal processing step is needed to form both amorphous layer 40 and crystalline layer 42, thereby achieving a low fabrication cost of integrated circuit 10. In addition, the formation of amorphous layer 40 between substrate 14 and crystalline layer 42 results in a high quality for gate dielectric 29 by operating as a transition material to absorb lattice stress between substrate 14 and crystalline layer 42.

Figure 3:
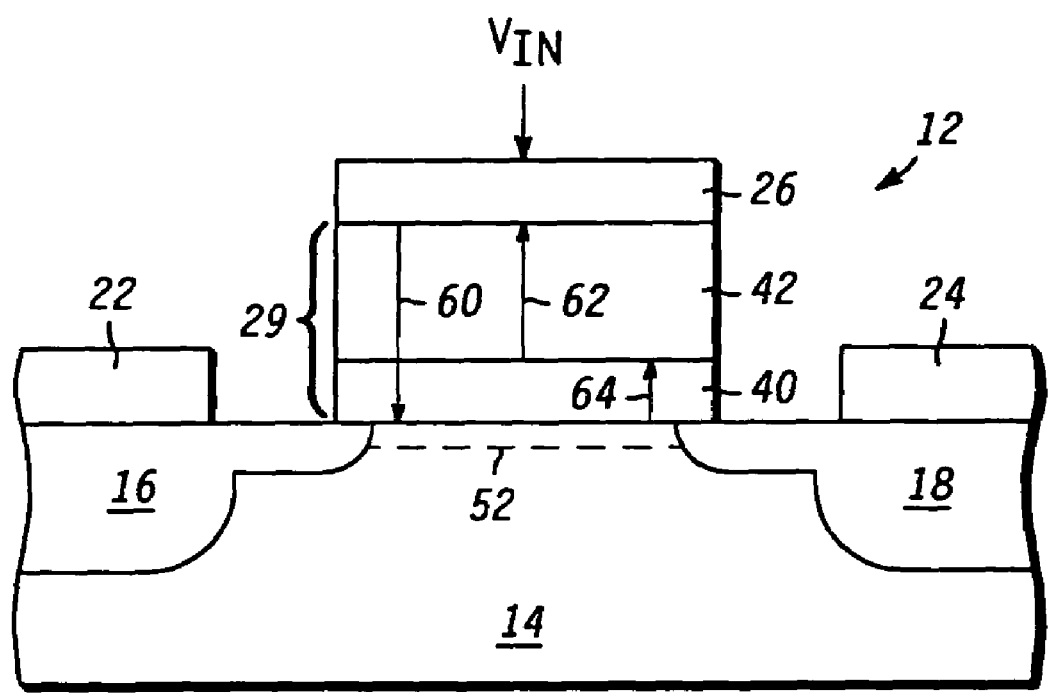
FIG. 3 shows a cross-sectional view of the integrated circuit at a later stage of fabrication.

FIG. 3 shows a cross-sectional view of integrated circuit 10 at a later processing step than the step described in FIG. 2. Transistor 12 includes drain 16 and source 18 formed in substrate 14. Gate dielectric 29 includes amorphous layer 40 and crystalline layer 42. A gate electrode 26 is disposed over gate dielectric 29 to produce a gate capacitance between gate electrode 26 and substrate 14 which is charged by a control signal VIN applied to gate electrode 26.

Amorphous layer 40 typically comprises silicon dioxide grown to a thickness of ten angstroms. Depending on the application, the thickness of amorphous layer 40 typically ranges between eight and thirty angstroms. Amorphous layer 40 typically has a relative permittivity, i.e., a dielectric constant, of approximately 3.9. Alternatively, amorphous layer 40 may comprise another material such as silicon nitride, strontium silicate, or the like. Amorphous layer 40 preferably has a dielectric constant less than about ten.

Crystalline layer 42 is formed with strontium titanate typically grown to a thickness of approximately fifty angstroms. Depending on the application, the thickness of crystalline layer 42 typically ranges from thirty to one hundred angstroms. In the embodiment of FIG. 3, crystalline layer 42 has a dielectric constant of approximately two hundred, with a range between thirty and three hundred. The dielectric constant of crystalline layer 42 preferably is greater than the dielectric constant of amorphous layer 40.

Note that crystalline layer 42 may be formed with materials other than strontium titanate. For example, Perovskite materials formed by combining alkaline earth metals, e.g., lanthanum, barium, strontium, or magnesium, with transition metals, e.g., titanium, aluminum, or zirconium, can be used to form crystalline layer 42.

In operation, control signal VIN is applied to gate 26 to charge the gate capacitance of transistor 12. An electric field 60 is produced across gate dielectric 29 which modifies the conductivity of substrate 14 and produces a conduction channel 52 in substrate 14 between source 18 and drain 16. In response to electric field 60, a polarizing field 62 is produced within crystalline layer 42 and a polarizing field 64 is produced within amorphous layer 40. Since the dielectric constant of crystalline layer 42 is greater than the dielectric constant of amorphous layer 40, polarizing field 64 is greater than polarizing field 62.

The gate capacitance of transistor 12 depends on the thickness and effective permittivity of gate dielectric 29. As a consequence of the present invention, gate dielectric 29 can be grown to a greater thickness than transistors having low permittivity gate dielectrics. The increased thickness virtually eliminates excessive gate leakage of transistor 12 to improve the performance of integrated circuit 10. In addition, the low relative permittivity of amorphous layer 40 reduces fringing fields of transistor 12 due to control signal VIN, thereby avoiding short channel effects and improving control over the threshold voltage of transistor 12.

Hence, it should be appreciated that the present invention provides a transistor which can be scaled to dimensions less than one hundred nanometeis while maintaining high performance operation and a low fabrication cost. A dual layer gate dielectric is formed over a semiconductor substrate to include a first layer formed with an amorphous material and a second layer formed with a crystalline material. The amorphous material provides a transition for a lattice mismatch between the substrate and the monocrystalline material, and has a low dielectric constant to reduce fringing fields. The monocrystalline material has a high dielectric constant, in part due to its crystalline nature, and is formed to a thickness adequate to eliminate excessive gate leakage.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor device, comprising:
   a semiconductor substrate; and
   a dielectric layer formed over the semiconductor substrate and having a first portion formed with an amorphous material and a second portion formed with a monocrystalline material, where an electric field in the dielectric layer controls a conductivity of the semiconductor substrate.

2. The semiconductor device of claim 1, further comprising a control electrode overlying the dielectric layer for establishing the electric field between the control electrode and the semiconductor substrate.

3. The semiconductor device of claim 2, further comprising:
   a drain; and
   a source, where the electric field generates a conduction channel in the substrate to couple the drain to the source.

4. The semiconductor device of claim 1, wherein the first portion of the dielectric layer is formed adjacent to the semiconductor substrate and the second portion of the dielectric layer is formed between the first portion and the control electrode.

5. The semiconductor device of claim 1, wherein the amorphous material includes silicon dioxide.

6. The semiconductor device of claim 1, wherein the monocrystalline material includes a material selected from the group consisting of barium, strontium, titanium, lanthanum, zirconium, aluminum and oxygen.

7. The semiconductor device of claim 1, wherein the first portion of the dielectric layer has a relative permittivity less than ten and the second portion of the dielectric layer has a relative permittivity greater than thirty.

8. The semiconductor device of claim 7, wherein the dielectric layer is formed with a thickness greater than thirty angstroms.

9. A transistor, comprising:
   a substrate;
   a gate electrode disposed over the substrate for generating a conduction channel in the substrate in response to a control signal; and
   a dielectric formed over the conduction channel, the dielectric including a first layer formed with an amorphous material, a second layer formed with a monocrystalline material disposed between the first layer and the gate electrode.

10. The transistor of claim 9, further comprising a source and a drain, where the conduction channel couples the source to the drain to control a current of the transistor.

11. The transistor of claim 10, wherein a length of the conduction channel is less than one hundred nanometers.

12. The transistor of claim 9, wherein the monocrystalline material has a higher permittivity than the amorphous material.

13. The transistor of claim 9, wherein the dielectric is formed with a thickness greater than thirty angstroms.

14. A method of operating a transistor, comprising the steps of:
   providing a gate dielectric overlying a semiconductor substrate; and
   applying a control signal to generate a first field in an amorphous layer of the gate dielectric and a second field in a monocrystalline layer of the gate dielectric.

15. The method of claim 14, further comprising the step of generating a conduction path of the transistor in the semiconductor substrate with the control signal.

16. The method of claim 14, wherein the step of applying includes the step of generating the first field adjacent to the semiconductor substrate.

17. The method of claim 14, wherein the step of applying includes the step of polarizing the gate dielectric with the control signal.

18. The method of claim 17, wherein the step of polarizing includes the step of polarizing silicon dioxide with the first field.

19. The method of claim 17, wherein the step of polarizing includes the step of polarizing a material based on the group consisting of barium, strontium, titanium, lanthanum, zirconium, aluminum and oxygen with the second field.

20. The method of claim 14, further comprising the steps of:

polarizing the amorphous layer to generate a first polarization field; and polarizing the monocrystalline layer to generate a second polarization field greater than the first polarization field.

* * * * *